US012577668B2

(12) United States Patent
Bhatnagar et al.

(10) Patent No.: US 12,577,668 B2
(45) Date of Patent: Mar. 17, 2026

(54) METHODS OF LOWERING DEPOSITION RATE

(71) Applicant: Applied Materials, Inc., Santa Clara, CA (US)

(72) Inventors: Kunal Bhatnagar, Chandler, AZ (US); Mohith Verghese, Phoenix, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 337 days.

(21) Appl. No.: 17/829,806

(22) Filed: Jun. 1, 2022

(65) Prior Publication Data

US 2022/0380897 A1     Dec. 1, 2022

Related U.S. Application Data

(60) Provisional application No. 63/195,328, filed on Jun. 1, 2021.

(51) Int. Cl.
*C23C 16/455*     (2006.01)
*C23C 16/04*     (2006.01)
*C23C 16/40*     (2006.01)
*C23C 16/56*     (2006.01)

(52) U.S. Cl.
CPC ...... *C23C 16/45553* (2013.01); *C23C 16/045* (2013.01); *C23C 16/405* (2013.01); *C23C 16/56* (2013.01)

(58) Field of Classification Search
CPC . C23C 16/04; C23C 16/045; C23C 16/45534; H01L 21/28562
See application file for complete search history.

(56) References Cited

U.S. PATENT DOCUMENTS

| | | | |
|---|---|---|---|
| 10,741,674 | B2 | 8/2020 | Yu et al. |
| 2011/0159690 | A1 | 6/2011 | Chandrashekar et al. |
| 2018/0277431 | A1 | 9/2018 | Chandrashekar et al. |
| 2019/0067014 | A1 | 2/2019 | Shrestha et al. |
| 2019/0164887 | A1* | 5/2019 | Wang ................. H01L 23/5283 |
| 2019/0390340 | A1* | 12/2019 | Yu ..................... C23C 16/45544 |
| 2020/0332416 | A1 | 10/2020 | Fluit |

FOREIGN PATENT DOCUMENTS

| | | | |
|---|---|---|---|
| KR | 20210027069 | * | 3/2021 |
| KR | 20210027069 | A | 3/2021 |
| KR | 20210050453 | A | 5/2021 |
| WO | 2021/1060864 | * | 1/2021 |
| WO | 2021076636 | A1 | 4/2021 |

OTHER PUBLICATIONS

PCT International Search Report and Written Opinion in PCT/US2022/031774 dated Sep. 19, 2022, 11 pages.
"Tertiary alkyl halides as growth activator and inhibitor for novel atomic layer deposition of low resistive titanium nitride", AIP Advances 11, 015218 (2021), 10 pages.

* cited by examiner

*Primary Examiner* — Tabassom Tadayyon Eslami
(74) *Attorney, Agent, or Firm* — SERVILLA WHITNEY LLC

(57)     ABSTRACT

A deposition method demonstrating a slower growth rate is disclosed. Some embodiments of the disclosure provide CVD methods which utilize a halide-containing growth inhibitor as a co-reactant with a metal halide precursor and a reactant. Some embodiments of the disclosure relate to CVD and ALD methods comprising exposure of the substrate surface to a pretreatment comprising a halide-containing growth inhibitor.

15 Claims, 3 Drawing Sheets

100

300

METHODS OF LOWERING DEPOSITION RATE

CROSS-REFERENCE TO RELATED APPLICATIONS

This application claims priority to U.S. Provisional Application No. 63/195,328, filed Jun. 1, 2021, the entire disclosure of which is hereby incorporated by reference herein.

TECHNICAL FIELD

Embodiments of the disclosure generally relate to methods for lowering the deposition rate of metal-containing materials. In particular, embodiments of the disclosure relate to methods of inhibiting growth by exposure to a halide-containing growth inhibitor.

BACKGROUND

The control of deposition rate is an ongoing pursuit in semiconductor manufacturing. One application in which the control of deposition rate is particularly of interest is the filling of substrate features (e.g., vias, trenches, etc.) with gapfill materials.

Traditional deposition methods may result in deposition rate which are too high, leading to an accumulation of material near the opening of the feature without filling the bottom of the feature. If these openings are not kept open, the feature may be closed off, resulting in a void within the feature. Typical gapfill methods may also produce seams in the deposited material near the center of the feature.

These defects (e.g. seams and voids) can cause issues during downstream processing. The issues are often evidenced most clearly by etch processes which impact the defects differently than the surrounding gap fill. These defects can also cause deterioration of the pattern/device which contains the gap fill over time resulting in device failure.

For some metal gapfill applications (e.g, 3DNAND, DRAM and MEOL logic), it is desirable to have super-conformal growth or a bottom-up gapfill for complete gapfill in complex re-entrant structures where traditional ALD (with conformal coverage) fails.

Accordingly, there is a need for deposition processes which provide lower deposition rates, superconformal deposition and/or bottom-up gapfill of metal-containing materials.

SUMMARY

One or more embodiments of the disclosure are directed to a deposition method comprising exposing a substrate surface to a halide-containing growth inhibitor and exposing the substrate surface to a metal halide precursor and a reactant to form a metal-containing layer. The growth rate of the metal-containing layer is lower than a similar deposition method without exposing the substrate surface to the halide-containing growth inhibitor.

Additional embodiments of the disclosure are directed to a deposition method comprising exposing a dielectric surface with a feature formed therein to HCl, $MoO_2Cl_2$, and hydrogen gas ($H_2$) to form a molybdenum layer within the trench. The molybdenum layer is deposited with a greater thickness at the bottom of the trench than outside of the trench.

Further embodiments of the disclosure are directed to a deposition method comprising exposing a dielectric surface with a feature formed therein to a t-butyl chloride to form a treated surface. The treated surface is exposed to a molybdenum halide precursor to chemisorb molybdenum species onto the treated surface within the trench. The treated surface is exposed to a reactant to react with the molybdenum species and form a molybdenum layer on the treated surface within the trench. The molybdenum layer is deposited with a greater thickness at the bottom of the trench than outside of the trench.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
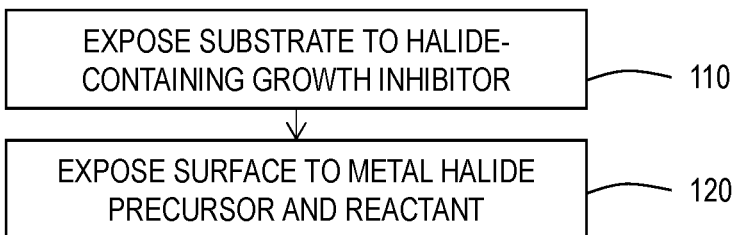
FIG. 1 illustrates a process flow diagram of a method in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

One or more embodiment of the disclosure is directed to deposition methods utilizing a halide-containing growth inhibitor for lowering the growth rate of the deposited film. Some embodiments of the disclosure utilize chemical vapor deposition or atomic layer deposition. In some embodiments, the halide-containing growth inhibitor comprises a hydrogen halide or an alkyl halide. In some embodiments, the deposited materials comprises molybdenum.

Some embodiments of the disclosure advantageously provide bottom-up gapfill without seams or voids. Some embodiments of the disclosure advantageously provide superconformal deposition within a feature. As used in this regard, "superconformal" means a layer which has a greater average thickness near the bottom of a feature than near the top of the feature.

Figure 2:
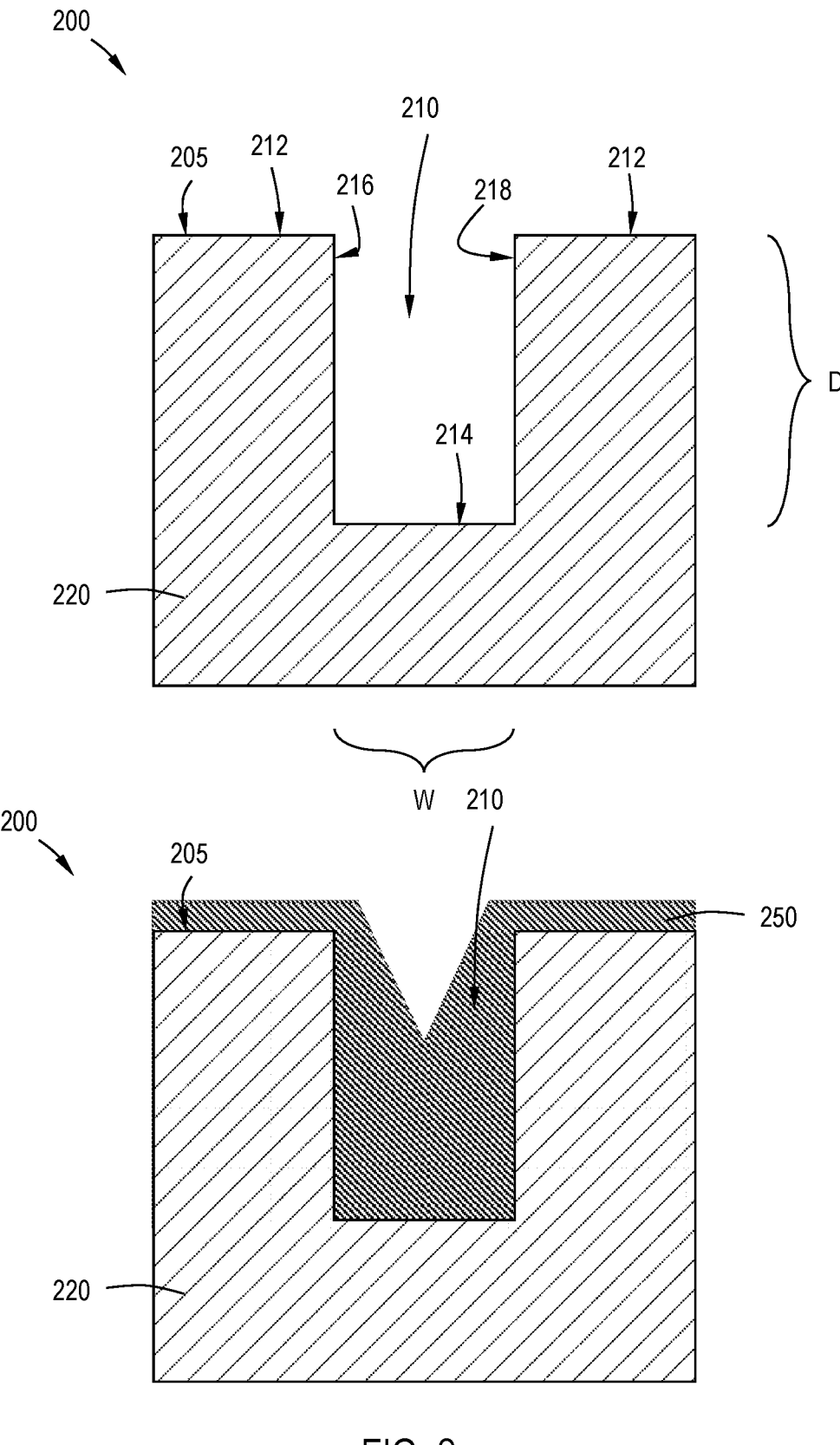
FIG. 2 illustrates a substrate during processing in accordance with one or more embodiment of the disclosure.

Referring to FIGS. 1 and 2, one or more embodiment of the disclosure provides a deposition method 100. The method 100 begins at operation 110 by exposing a substrate 200 having a substrate surface 205 to a halide-containing growth inhibitor. In some embodiments, the substrate 200 comprises a dielectric material 220. In some embodiments, the substrate surface 205 is an oxide surface.

In some embodiments, as shown in FIG. 2, the substrate 200 has at least one feature 210 formed therein. The feature 210 extends a depth D from a top surface 212 outside of the feature 210 to a bottom 214. The feature 210 has an average width W between sidewall 216 and sidewall 218. For the avoidance of doubt, the cross-section of substrate 200 illustrated in 200 illustrates two sidewalls, but in practice the feature 210 may have any number of distinct sidewalls (e.g., one sidewall for a cylindrical via, two sidewalls for a trench, etc.).

The halide-containing growth inhibitor comprises a suitable halide-containing species. In some embodiments, the halide-containing growth inhibitor comprises a hydrogen halide. In some embodiments, the halide-containing growth inhibitor comprises or consists essentially of HCl. As used in this regard, a halide-containing growth inhibitor which consists essentially of a stated species comprises greater than or equal to 95%, greater than or equal to 98%, greater than or equal to 99% or greater than or equal to 99.5% of the stated species on a molar basis, excluding any inert diluent or carrier gasses.

In some embodiments, the halide-containing growth inhibitor comprises substantially no fluorine. As used in this regard, the halide-containing growth inhibitor comprises substantially no fluorine when the halide-containing growth inhibitor contains less than or equal to 1 atomic percent, less than or equal to 0.5 atomic percent or less than or equal to 0.1 atomic percent fluorine on an atomic count basis.

In some embodiments, the halide-containing growth inhibitor comprises an alkyl halide. In some embodiments, the alkyl halide comprises one to four, one to six, one to eight, four to eight, or six to eight carbon atoms. In some embodiments, the halide-containing growth inhibitor comprises or consists essentially of a t-butyl halide. In some embodiments, the halide-containing growth inhibitor comprises or consists essentially of t-butyl chloride, t-butyl bromide, or t-butyl iodide.

Referring again to FIGS. 1 and 2, the method 100 continues at operation 120 by exposing the substrate surface 205 to a metal halide precursor and a reactant to form a metal-containing layer 250.

In some embodiments, the method 100 is performed by chemical vapor deposition (CVD). In these embodiments, the substrate surface is exposed to the metal halide precursor and the reactant as a combined reactive gas. In some embodiments, the substrate surface may be exposed to the halide-containing growth inhibitor before exposure to the combined reactive gas. For these embodiments, exposure of the substrate surface 205 to the halide-containing growth inhibitor creates a treated surface. In some embodiments, the substrate surface may be exposed to the halide-containing growth inhibitor as part of the combined reactive gas.

The metal halide precursor may be any suitable metal precursor which contains at least one halide ligand. In some embodiments, the metal halide precursor is homoleptic and the halide ligand is the only ligand present (e.g., $TiCl_4$). In some embodiments, the metal halide precursor is heteroleptic and the halide ligand is present with other ligands (e.g., $WOCl_4$).

In some embodiments, the metal halide precursor comprises one or more of W, Ti, Ta, Ru, Mo, Cu or Co. In some embodiments, the metal of the metal halide precursor comprises or consists essentially of molybdenum. In some embodiments, the metal halide precursor comprises or consists essentially of $MoO_2Cl_2$, $MoCl_5$, $MoOCl_4$, $WCl_5$. Or $TaCl_5$. In some embodiments, the metal halide precursor comprises substantially no $TiCl_4$.

The halide-containing growth inhibitor and the metal halide precursor each comprise species containing one or more halide groups. In some embodiments, the halide of the halide-containing growth inhibitor and the halide of the metal halide precursor are the same halide. For example, in some embodiments, the halide-containing growth inhibitor comprises HCl and the metal halide precursor comprises $MoO_2Cl_2$ (both contain chloride).

According to one or more embodiments, the method 100 uses a chemical vapor deposition (CVD) process. Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

According to one or more embodiments, the method 100 uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

The metal-containing layer can be grown by atomic layer deposition or chemical vapor deposition for many applications. One or more embodiments of the disclosure advantageously provide processes for atomic layer deposition or chemical vapor deposition to form metal-containing layers with a lower growth rate. As used in this specification and the appended claims, the term "metal-containing layer" refers to a layer or film that comprises metal atoms and has greater than or equal to about 1 atomic % metal, greater than or equal to about 2 atomic % metal, greater than or equal to about 3 atomic % metal, greater than or equal to about 4 atomic % metal, greater than or equal to about 5 atomic % metal, greater than or equal to about 10 atomic % metal, greater than or equal to about 15 atomic % metal, greater than or equal to about 20 atomic % metal, greater than or equal to about 25 atomic % metal, greater than or equal to about 30 atomic % metal, greater than or equal to about 35 atomic % metal, greater than or equal to about 40 atomic % metal, greater than or equal to about 45 atomic % metal, greater than or equal to about 50 atomic % metal, or greater than or equal to about 60 atomic % metal. In some embodiments, the metal-containing layer comprises one or more of a metal layer (elemental metal), metal oxide ($MO_x$), metal carbide ($MC_x$), metal silicide ($MSi_x$), or metal nitride ($MN_x$). The skilled artisan will recognize that the use of molecular formula like $MSi_x$ does not imply a specific stoichiometric relationship between the elements but merely the identity of the major components of the film. For example, $MSi_x$ refers to a film whose major composition comprises one or more metal and silicon atoms. In some embodiments, the major composition of the specified film (i.e., the sum of the atomic percents of the specified atoms) is greater than or equal to about 95%, 98%, 99% or 99.5% of the film, on an atomic basis.

Figure 3:
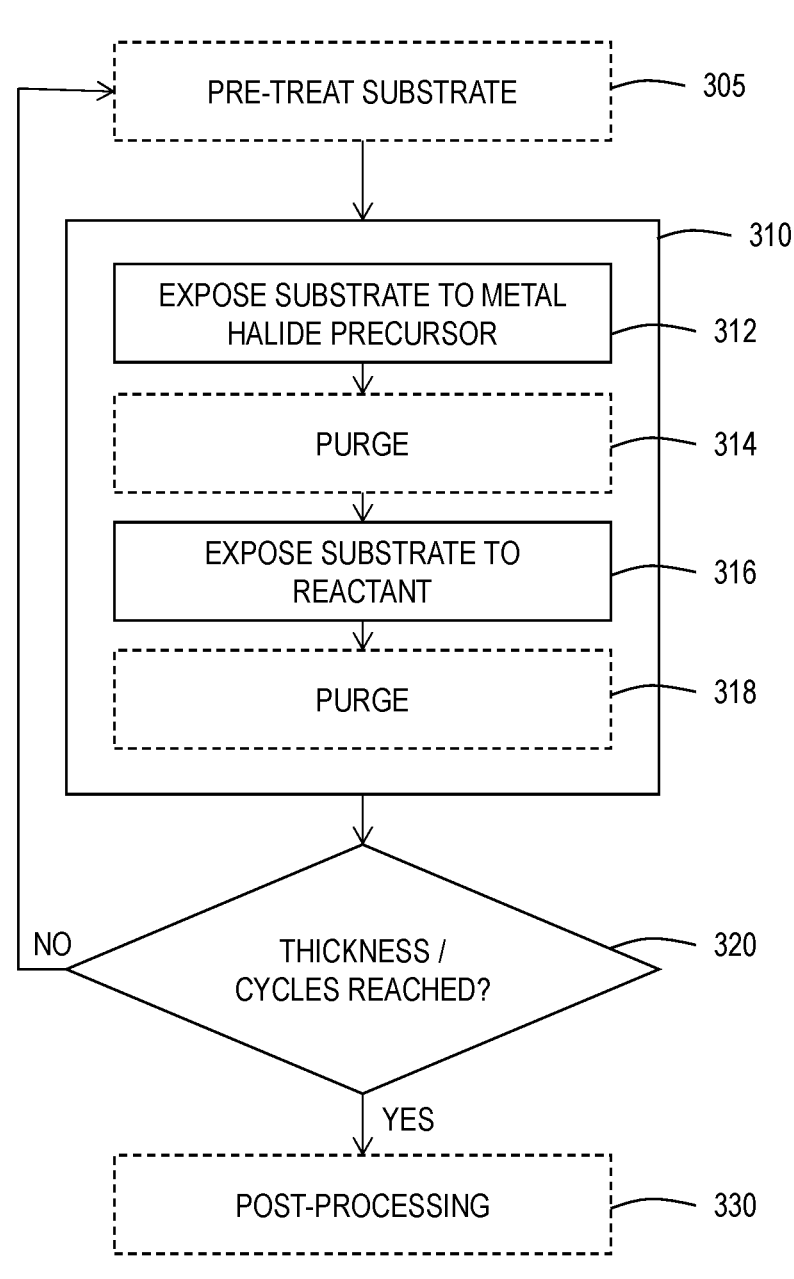
FIG. 3 illustrates a process flow diagram of a method in accordance with one or more embodiment of the disclosure.

With reference to FIG. 3, one or more embodiments of the disclosure are directed to method 300 of depositing a metal-containing layer at a relatively low deposition rate that is representative of an atomic layer deposition (ALD) process (the substrate or substrate surface is exposed sequentially to the reactive gases in a manner that prevents or minimizes gas phase reactions of the reactive gases). In other embodiments (not shown), the method 100 comprises a chemical vapor deposition (CVD) process in which the reactive gases are mixed in the processing chamber to allow gas phase reactions of the reactive gases and deposition of the metal-containing layer.

In some embodiments, the method 300 includes a pre-treatment operation 305. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, operation 305 comprises exposing the substrate surface to the halide-containing growth inhibitor.

Without being bound by theory, it is believed that exposing the substrate surface to the halide-containing growth inhibitor before deposition 310 decreases the number of reactive sites available for chemisorption of the metal halide precursor. Accordingly, pre-treatment 305 decreases the growth rate of the metal-containing layer by reducing the metal halide precursor available for reaction on the substrate surface.

At deposition 310, a process is performed to deposit a metal-containing layer on the substrate (or substrate surface). The deposition process can include one or more operations to form a film on the substrate. In operation 312, the substrate (or substrate surface) is exposed to the metal halide precursor to deposit a film on the substrate (or substrate surface). As identified above, the metal halide precursor can be any suitable compound that can react with (i.e., adsorb or chemisorb onto) the substrate surface to leave a metal-containing species on the substrate surface.

At operation 314, the processing chamber is optionally purged to remove unreacted metal halide precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the metal halide precursor by any suitable technique including, but not limited to, moving the substrate through a gas curtain to a portion or sector of the processing chamber that contains none or substantially none of the metal halide precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar).

At operation 316, the substrate (or substrate surface) is exposed to a reactant to form a metal-containing layer on the substrate surface. The reactant can react with the metal-containing precursor species on the substrate surface to form the metal-containing layer. In some embodiments, the reactant comprises a reducing agent. In one or more embodiments, the reducing agent can comprise any reducing agent known of to one of skill in the art. In other embodiments, the reactant comprises an oxidizing agent. In one or more embodiments, the oxidizing agent can comprise any oxidizing agent known to one of skill in the art. In further embodiments, the reactant comprises one or more oxidizing agent and a reducing agent.

In specific embodiments, the reactant is selected from one or more of 1,1-dimethylhydrazine (DMH), alkyl amine, hydrazine, alkyl hydrazine, allyl hydrazine, hydrogen ($H_2$), ammonia ($NH_3$), alcohols, water ($H_2O$), oxygen ($O_2$), ozone ($O_3$), nitrous oxide ($N_2O$), nitrogen dioxide ($NO_2$), peroxides, and plasmas thereof. In some embodiments, the alkyl amine is selected from one or more of tert-butyl amine ($tBuNH_2$), isopropyl amine ($iPrNH_2$), ethylamine ($CH_3CH_2NH_2$), diethylamine (($CH_3CH_2)_2NH$), or butyl amine ($BuNH_2$). In some embodiments, the reactant comprises one or more of compounds with the formula $R'NH_2$, $R'_2NH$, $R'_3N$, $R'_2SiNH_2$, $(R'_3Si)_2NH$, $(R'_3Si)_3N$; where each R' is independently H or an alkyl group having 1-12 carbon atoms. In some embodiments, the alkyl amine consists essentially of one or more of tert-butyl amine ($tBuNH_2$), isopropyl amine ($iPrNH_2$), ethylamine ($CH_3CH_2NH_2$), diethylamine (($CH_3CH_2)_2NH$), butyl amine ($BuNH_2$).

At operation 318, the processing chamber is optionally purged after exposure to the reactant. Purging the processing chamber in operation 318 can be the same process or different process than the purge in operation 314. Purging the processing chamber, portion of the processing chamber, area adjacent the substrate surface, etc., removes unreacted reactant, reaction products and by-products from the area adjacent the substrate surface.

At decision 320, the thickness of the deposited metal-containing layer, or number of cycles of metal halide precursor and reactant is considered. If the metal-containing layer has reached a predetermined thickness or a predetermined number of process cycles have been performed, the method 300 moves to an optional post-processing operation 330. If the thickness of the deposited film or the number of process cycles has not reached the predetermined threshold, the method 300 returns to operation 310 to expose the substrate surface to the metal halide precursor again in operation 312, and continuing. In some embodiments, the method 300 repeats the pre-treatment operation 305 before continuing to operation 310. In some embodiments, pre-treatment operation 305 is only repeated at a regular interval (e.g., after 5, 10 or 20 deposition cycles).

The optional post-processing operation 330 can be, for example, a process to modify film properties (e.g., annealing) or a further film deposition process (e.g., additional ALD or CVD processes) to grow additional films. In some embodiments, the optional post-processing operation 330 can be a process that modifies a property of the deposited film. In some embodiments, the optional post-processing operation 330 comprises annealing the as-deposited metal-containing layer. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the metal-containing layer is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

The method 300 can be performed at any suitable temperature depending on, for example, the metal halide precursor, reactant or thermal budget of the device. In one or more embodiments, the use of high temperature processing may be undesirable for temperature-sensitive substrates, such as logic devices. In some embodiments, exposure to the metal halide precursor (operation 312) and the reactant (operation 316) occur at the same temperature. In some embodiments, the substrate is maintained at a temperature in a range of about 20° C. to about 400° C., or about 50° C. to about 650° C.

In some embodiments, exposure to the metal halide precursor (operation 312) occurs at a different temperature than the exposure to the reactant (operation 316). In some embodiments, the substrate is maintained at a first temperature in a range of about 20° C. to about 400° C., or about 50° C. to about 650° C., for the exposure to the metal halide precursor, and at a second temperature in the range of about 20° C. to about 400° C., or about 50° C. to about 650° C., for exposure the reactant.

In the embodiment illustrated in FIG. 3, at deposition operation 310 the substrate (or substrate surface) is exposed to the metal halide precursor and the reactant sequentially. In another embodiment, not shown, the substrate (or substrate surface) is exposed to the metal halide precursor and the reactant simultaneously in a CVD reaction. In a CVD reaction, the substrate (or substrate surface) can be exposed to a gaseous mixture of the metal halide precursor and reactant to deposit the metal-containing layer having a predetermined thickness.

In some embodiments, the halide-containing growth inhibitor is mixed with the metal halide precursor and the reactant to be exposed to the substrate at the same time. In some embodiments, the halide-containing growth inhibitor is exposed to the substrate before exposure to the mixture of the metal halide precursor and the reactant (similar to the pre-treatment described above). In the CVD reaction, the metal-containing layer can be deposited in one exposure to the mixed reactive gas (metal halide precursor and reactant), or can be multiple exposures to the mixed reactive gas with purges between.

In some embodiments, the metal-containing layer formed comprises elemental metal. Stated differently, in some embodiments, the metal-containing layer consists essentially of one or more metals. As used in this manner, the term "consists essentially of one or more metals" means that the metal-containing layer is greater than or equal to about 95%, 98%, 99% or 99.5% metal, on an atomic basis. Measurements of the composition of the metal-containing layer refer to the bulk portion of the film, excluding interface regions where diffusion of elements from adjacent films may occur.

In other embodiments, the metal-containing layer comprises a metal oxide ($MO_x$) with an oxygen content of greater than or equal to about 5%, 7.5%, 10%, 12.5 or 15%, on an atomic basis. In some embodiments, the metal-containing layer comprises an oxygen content in the range of about 2% to about 30%, or in the range of about 3% to about 25%, or in the range of about 4% to about 20%, on an atomic basis.

In other embodiments, the metal-containing layer comprises a metal carbide ($MC_x$) with a carbon content of greater than or equal to about 5%, 7.5%, 10%, 12.5 or 15%, on an atomic basis. In some embodiments, the metal-containing layer comprises a carbon content in the range of about 2% to about 30%, or in the range of about 3% to about 25%, or in the range of about 4% to about 20%, on an atomic basis.

The deposition operation 310 can be repeated to form one or more of a metal oxide film, a metal carbide film, a metal silicide film, or a metal nitride film, having a predetermined thickness. In some embodiments, the deposition operation 310 is repeated to provide one or more of a metal oxide film, a metal carbide film, a metal silicide film, or a metal nitride film having a thickness in the range of about 0.3 nm to about 100 nm, or in the range of about 30 Å to about 3000 Å.

One or more embodiments of the disclosure are directed to methods of depositing metal-containing layers in high aspect ratio features. A high aspect ratio feature is a trench, via, etc. having a depth:width ratio greater than or equal to about 10, 20, 50, or more.

In some embodiments, the metal-containing layer is deposited conformally on the feature. As used in this manner, a conformal film has a thickness near the top of the feature that is in the range of about 100-120% or 100-110% of the thickness at the bottom of the feature.

In some embodiments, the metal-containing layer is deposited superconformally on the feature. As used in this manner, a superconformal film has a thickness near the bottom of the feature that is in the range of about 100-120% or 100-110% of the thickness at the top of the feature. Stated differently, in some embodiments, the metal-containing film is deposited with a greater thickness at the bottom than outside the at least one feature.

Some embodiments of the disclosure are directed to methods for bottom-up gapfill of a feature. A bottom-up gapfill process primarily fills the feature from the bottom versus a conformal process which primarily fills the feature from the bottom and sides. In some embodiments, the superconformal deposition in the feature results in greater deposition near the bottom of the feature than near the top of the feature, resulting in bottom-up gapfill.

According to one or more embodiments, the substrate may be subjected to processing prior to and/or after forming the metal-containing layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed.

The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A deposition method comprising:
exposing a substrate surface to a halide-containing growth inhibitor comprising an alkyl halide; and
exposing the substrate surface to a metal halide precursor and a reactant to form a metal-containing layer,
wherein a growth rate of the metal-containing layer is lower than a similar deposition method without exposing the substrate surface to the halide-containing growth inhibitor,
wherein the substrate surface has at least one feature formed therein, the at least one feature extending a depth to a bottom and having a width defined by an average distance between two sidewalls, wherein the metal-containing layer is deposited with a greater thickness at the bottom than on a top of the at least one feature, and wherein the thickness of the metal-containing layer at the bottom of the at least one feature is in a range of about 100-120% of the thickness at the top of the at least one feature.

2. The method of claim 1, wherein the halide-containing growth inhibitor comprises substantially no fluorine.

3. The method of claim 1, wherein the alkyl halide comprises a t-butyl halide.

4. The method of claim 1, wherein the halide of the halide-containing growth inhibitor and the halide of the metal halide precursor are the same halide.

5. The method of claim 1, wherein the metal-containing layer is formed by chemical vapor deposition (CVD).

6. The method of claim 5, wherein exposing the substrate surface to the halide-containing growth inhibitor forms a treated substrate surface and the treated substrate surface is exposed to the metal halide precursor and the reactant.

7. The method of claim 5, wherein the substrate surface is exposed to the halide-containing growth inhibitor, the metal halide precursor, and the reactant simultaneously.

8. The method of claim 1, wherein the metal-containing layer is formed by atomic layer deposition.

9. The method of claim 8, wherein exposing the substrate surface to the halide-containing growth inhibitor forms a treated substrate surface and the treated substrate surface is sequentially exposed to the metal halide precursor and the reactant.

10. The method of claim 1, wherein the metal-containing layer is formed as a bottom-up gapfill material.

11. The method of claim 10, wherein the bottom-up gapfill material is substantially free of voids or seams.

12. The method of claim 1, wherein the metal-containing layer comprises molybdenum.

13. The method of claim 1, wherein the metal-containing layer comprises a metal layer or a metal oxide layer.

14. The method of claim 1, wherein the metal-containing layer is formed on a dielectric material.

15. A deposition method comprising:
exposing a dielectric surface with at least one feature formed therein to a t-butyl chloride growth inhibitor to form a treated surface on a top of the at least one feature, the at least one feature extending a depth from the top of the at least one feature to a bottom and having a width defined by an average distance between two sidewalls;
exposing the treated surface and the at least one feature to a molybdenum halide precursor to chemisorb molybdenum species onto the treated surface and within the at least one feature; and
exposing the treated surface and the at least one feature to a reactant to react with the molybdenum species and form a molybdenum layer on the treated surface and within the at least one feature,
wherein the molybdenum layer is deposited with a greater thickness at the bottom of the at least one feature than the top of the at least one feature, and wherein the thickness of the molybdenum layer at the bottom of the at least one feature is in a range of about 100-120% of the thickness at the top of the at least one feature.

\* \* \* \* \*